(12) United States Patent
Morishita (10) Patent No.: US 11,990,465 B2
(45) Date of Patent: May 21, 2024

(54) SEMICONDUCTOR DEVICE (71) Applicant: RENESAS ELECTRONICS CORPORATION, Tokyo (JP)

(72) Inventor: Yasuyuki Morishita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 413 days.

(21) Appl. No.: 17/349,547

(22) Filed: Jun. 16, 2021

(65) Prior Publication Data

US 2022/0020739 A1    Jan. 20, 2022

(30) Foreign Application Priority Data

Jul. 15, 2020 (JP) ................................. 2020-121141

(51) Int. Cl.
*H03K 17/687* (2006.01)
*H01L 27/02* (2006.01)
*H03K 17/693* (2006.01)

(52) U.S. Cl.
CPC ..... *H01L 27/0255* (2013.01); *H03K 17/6871* (2013.01)

(58) Field of Classification Search
None
See application file for complete search history.

(56) References Cited

U.S. PATENT DOCUMENTS

| | | | |
|---|---|---|---|
| 5,886,558 A | 3/1999 | Iijima et al. | |
| 6,075,686 A * | 6/2000 | Ker | ..................... H01L 27/0251 361/56 |
| 7,312,517 B2 * | 12/2007 | Hirata | ................. H01L 27/0251 257/E23.079 |
| 9,647,647 B2 | 5/2017 | Narita | |
| 9,712,165 B2 | 7/2017 | Okushima | |

FOREIGN PATENT DOCUMENTS

| | | |
|---|---|---|
| JP | H9-172146 A | 6/1997 |
| JP | 2004-282058 A | 10/2004 |
| JP | 2011-176031 A | 9/2011 |
| JP | 2017-37949 A | 2/2017 |

OTHER PUBLICATIONS

Notice of Reasons for Refusal received in Japanese Patent Application No. 2020-121141, mailed Oct. 24, 2023.

* cited by examiner

*Primary Examiner* — Kenneth B Wells
(74) *Attorney, Agent, or Firm* — Rimon P.C.

(57) ABSTRACT

A first ESD protection circuit is provided between a first high-potential side power supply and a first low-potential side power supply of a first power supply system and a second ESD protection circuit is provided between a second high-potential side power supply and a second low-potential side power supply of a second power supply system. A coupling circuit includes a bidirectional diode and couples the first and second low-potential side power supplies. A first transistor is composed of an n-channel MOS transistor, has a drain coupled to the first high-potential side power supply of the first power supply system, and has a back gate coupled to the second low-potential side power supply of the second power supply system. A resistor element is inserted in series between the drain of the first transistor and the first high-potential side power supply.

11 Claims, 10 Drawing Sheets

SEMICONDUCTOR DEVICE

CROSS-REFERENCE TO RELATED APPLICATIONS

The disclosure of Japanese Patent Application No. 2020-121141 filed on Jul. 15, 2020 including the specification, drawings and abstract is incorporated herein by reference in its entirety.

BACKGROUND

The present invention relates to a semiconductor device and relates to, for example, a countermeasure technology for the ESD (Electro Static Discharge).

Patent Document 1 discloses a configuration of an LSI chip including a plurality of power supply system circuit units, in which a bidirectional diode is provided between ground wirings of each power supply system circuit and a gate protection element is provided between an input node in an input inverter of each power supply system circuit and the ground.

There are disclosed techniques listed below.
[Patent Document 1] Japanese Unexamined Patent Application Publication No. 2004-282058

SUMMARY

For example, as described in Patent Document 1, in the semiconductor device including a plurality of power supply systems, the bidirectional diode is provided between the ground wirings of each power supply system in some cases. Also, as an input interface at the time of transmitting signals between different power supply systems, an intermediate buffer is provided in some cases in a front stage of the input inverter described in Patent Document 1. The intermediate buffer is coupled to a high-potential side power supply and a low-potential side power supply of a power supply system different from the high-potential side power supply, and includes an n-channel MOS transistor as a transistor coupled to the high-potential side power supply in some cases. However, in this case, there is a fear that the ESD resistance is lowered by the n-channel MOS transistor.

The embodiments described below have been made in consideration of this, and other problems and novel features thereof will become apparent from the description of this specification and accompanying drawings.

A semiconductor device according to an embodiment includes a first power supply system composed of a first high-potential side power supply and a first low-potential side power supply and a second power supply system composed of a second high-potential side power supply and a second low-potential side power supply, and the semiconductor device further includes first and second ESD protection circuits, a coupling circuit, and a first transistor. The first ESD protection circuit is provided between the first high-potential side power supply and the first low-potential side power supply and is configured to absorb an input surge, and the second ESD protection circuit is provided between the second high-potential side power supply and the second low-potential side power supply and is configured to absorb an input surge. The coupling circuit includes a bidirectional diode and is configured to couple the first low-potential side power supply and the second low-potential side power supply. The first transistor is composed of an n-channel MOS transistor, has a drain coupled to the first high-potential side power supply, and has a back gate coupled to the second low-potential side power supply. Here, the semiconductor device further includes a first resistor element or a third ESD protection circuit. The first resistor element is inserted in series between the drain of the first transistor and the first high-potential side power supply or is inserted in series between the back gate of the first transistor and the second low-potential side power supply. The third ESD protection circuit is provided between the first high-potential side power supply and the second low-potential side power supply and is configured to absorb an input surge.

According to the embodiment described above, it is possible to improve the ESD resistance in the semiconductor device including a plurality of power supply systems.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specific number is also applicable.

Furthermore, in the embodiments described below, it goes without saying that each component (including an element step) is not indispensable unless otherwise clearly specified or unless it is obvious that the component is indispensable in principle. Likewise, in the embodiments described below, when mentioning a shape, a positional relation, or the like of a component, a substantially approximate shape, a similar shape, or the like is included unless otherwise clearly specified or unless it is obvious from the context that the shape, the positional relation, or the like of the component differs in principle. The same applies to the above-described numerical value and range.

In addition, the circuit elements constituting each functional block of the embodiments are not particularly limited, but are formed on a semiconductor substrate made of single crystal silicon or the like by the integrated circuit technology for a well-known CMOS (Complementary MOS) transistor or the like. In the embodiments, an n-channel MOS (Metal Oxide Semiconductor) transistor is referred to as an nMOS transistor and a p-channel MOS transistor is referred to as a pMOS transistor.

Hereinafter, embodiments of the present invention will be described in detail with reference to the drawings. Note that the same members are denoted by the same reference characters and the repetitive description thereof will be omitted throughout the drawings for describing the embodiments.

First Embodiment ((Outline of Semiconductor Device))

Figure 1:
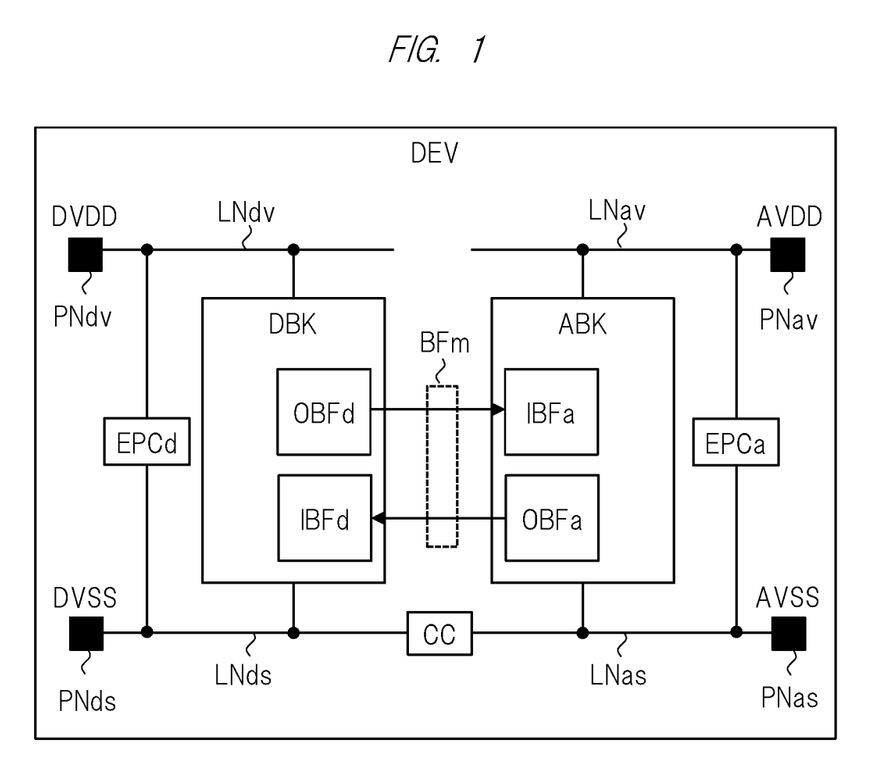
FIG. 1 is a block diagram showing a schematic configuration example of a semiconductor device according to the first embodiment of the present invention.

FIG. 1 is a block diagram showing a schematic configuration example of a semiconductor device according to the first embodiment of the present invention. The semiconductor device DEV of FIG. 1 is, for example, a microcontroller or a SoC (System on Chip) composed of one semiconductor chip. The semiconductor device DEV includes an analog circuit block ABK that is operated by a power supply system [1] and a digital circuit block DBK that is operated by a power supply system [2].

The power supply system [1] is composed of a high-potential side power supply AVDD and a low-potential side power supply AVSS, and the power supply system [2] is composed of a high-potential side power supply DVDD and a low-potential side power supply DVSS. The high-potential side power supply AVDD supplies a high-potential side power supply voltage (AVDD), and the low-potential side power supply AVSS supplies a low-potential side power supply voltage (AVSS). Similarly, the high-potential side power supply DVDD supplies a high-potential side power supply voltage (DVDD), and the low-potential side power supply DVSS supplies a low-potential side power supply voltage (DVSS).

The high-potential side power supply AVDD is composed of an external pad PNav to which the high-potential side power supply voltage (AVDD) is supplied from the outside and a high-potential side power supply wiring LNav configured to supply it to the inside. The low-potential side power supply AVSS is composed of an external pad PNas to which the low-potential side power supply voltage (AVSS) is supplied from the outside and a low-potential side power supply wiring LNas configured to supply it to the inside. Similarly, the high-potential side power supply DVDD is composed of an external pad PNdv to which the high-potential side power supply voltage (DVDD) is supplied from the outside and a high-potential side power supply wiring LNdv configured to supply it to the inside. The low-potential side power supply DVSS is composed of an external pad PNds to which the low-potential side power supply voltage (DVSS) is supplied from the outside and a low-potential side power supply wiring LNds configured to supply it to the inside.

The analog circuit block ABK is coupled to the power supply system [1] (AVDD, AVSS), and the digital circuit block DBK is coupled to the power supply system [2] (DVDD, DVSS). The digital circuit block DBK includes various digital circuits represented by, for example, a CPU (Central Processing Unit). The analog circuit block ABK includes various analog circuits represented by, for example, an ADC (Analog to Digital Converter) and a DAC (Digital to Analog Converter). At this time, for example, in order to prevent the noise generated in the digital circuit from propagating to the analog circuit, the power supply system [1] of the analog circuit and the power supply system [2] of the digital circuit are separated in this manner in many cases.

However, the low-potential side power supplies are usually coupled by a coupling circuit CC. Specifically, the coupling circuit CC couples the low-potential side power supply AVSS (specifically, low-potential side power supply wiring LNas) of the power supply system [1] and the low-potential side power supply DVSS (specifically, low-potential side power supply wiring LNds) of the power supply system [2]. The coupling circuit CC includes a bidirectional diode for suppressing noise propagation. Note that the high-potential side power supply voltage (AVDD) of the power supply system [1] and the high-potential side power supply voltage (DVDD) of the power supply system [2] may have the same voltage value or different voltage values.

The analog circuit block ABK includes an output buffer OBFa that serves as an output interface for the digital circuit block DBK and an input buffer IBFa that serves as an input interface for the digital circuit block DBK. Similarly, the digital circuit block DBK includes an output buffer OBFd that serves as an output interface for the analog circuit block ABK and an input buffer IBFd that serves as an input interface for the analog circuit block ABK.

Further, in the power supply system [1], an ESD protection circuit EPCa is provided between the high-potential side power supply AVDD (specifically, the high-potential side power supply wiring LNav) and the low-potential side power supply AVSS (specifically, the low-potential side power supply wiring LNas). The ESD protection circuit EPCa absorbs the surge input to the power supply system [1] (AVDD, AVSS). Similarly, in the power supply system [2], an ESD protection circuit EPCd is provided between the high-potential side power supply DVDD (specifically, the high-potential side power supply wiring LNdv) and the low-potential side power supply DVSS (specifically, the low-potential side power supply wiring LNds). The ESD protection circuit EPCd absorbs the surge input to the power supply system [2] (DVDD, DVSS).

Various generally known configurations can be used for the ESD protection circuits EPCa and EPCd. Typically, for example, the configuration in which an RC (resistor-capacitor) circuit and a bypass nMOS transistor are coupled in parallel between the high-potential side power supply and the low-potential side power supply can be used. The RC circuit functions as a timer circuit that is operated in response to noise, and ON/OFF of the bypass nMOS transistor is controlled by the output of the timer circuit. Further, although details will be described later, an intermediate buffer BFm that mediates the signal transmission between the analog circuit block ABK and the digital circuit block DBK is provided in FIG. 1.

Although the semiconductor device DEV of FIG. 1 is provided with two power supply systems, it may be provided with two or more power supply systems. Further, although the power supply systems are separated based on whether the analog circuit or the digital circuit is coupled thereto in this case, the method of separating the power supply systems is not limited to this. Namely, the semiconductor device DEV according to the first embodiment may have any configuration as long as it includes a plurality of power supply systems and signals are transmitted between a circuit block coupled to a certain power supply system and a circuit block coupled to another different power supply system.

((Configuration of Main Part and Operation of Semiconductor Device (Premise)))

Figure 9A:
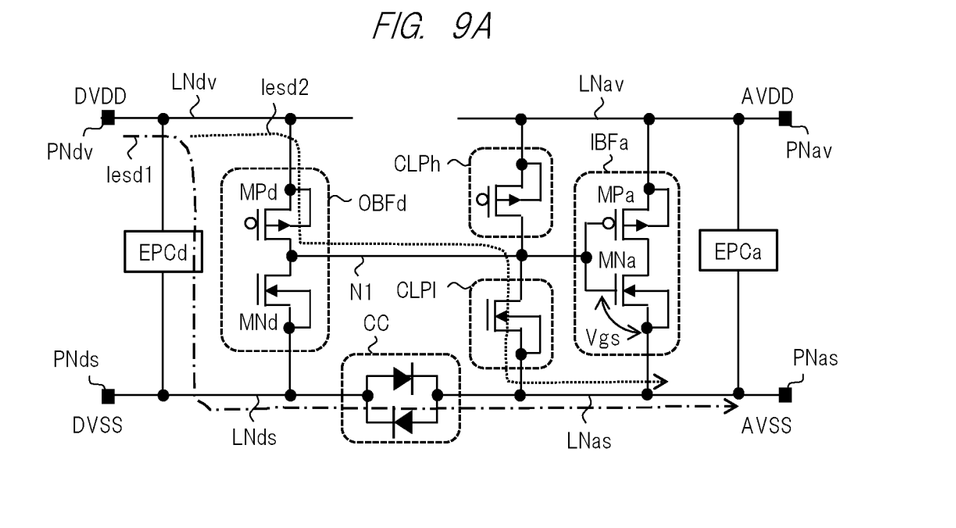
FIG. 9A is a circuit diagram showing a configuration example of a main part and an operation example in a semiconductor device studied as a premise of the present invention.
Figure 9B:
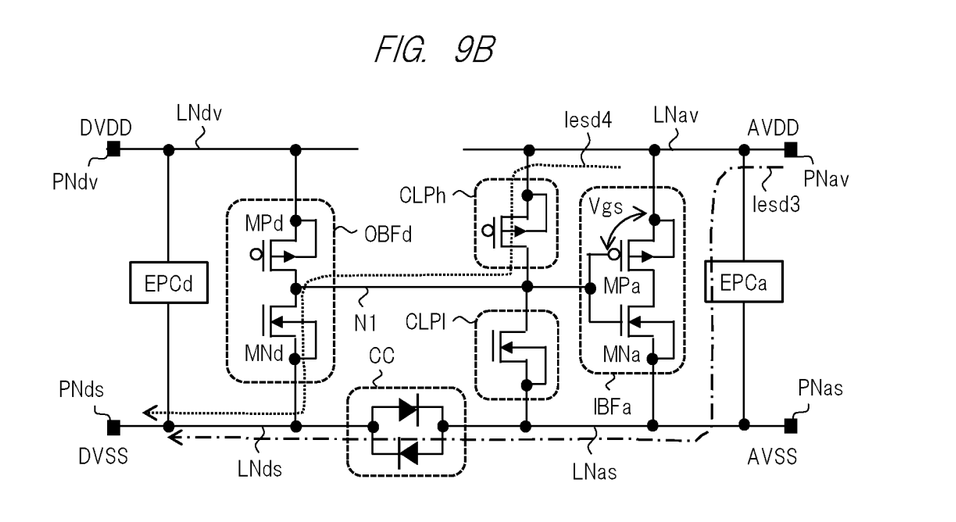
FIG. 9B is a circuit diagram showing a configuration example of a main part and an operation example in a semiconductor device studied as a premise of the present invention.

Here, prior to the detailed description of the semiconductor device according to the first embodiment, a semiconductor device studied as a premise of the present invention will be described for making the present invention easily understood. FIG. 9A and FIG. 9B are circuit diagrams each showing a configuration example of a main part and an operation example in the semiconductor device studied as a premise of the present invention. FIG. 9A and FIG. 9B each show the configuration example around the output buffer OBFd in the digital circuit block DBK and the input buffer IBFa in the analog circuit block ABK in FIG. 1.

The output buffer OBFd includes a pMOS transistor MPd and an nMOS transistor MNd. In the pMOS transistor MPd, the source is coupled to the high-potential side power supply DVDD (specifically, the high-potential side power supply wiring LNdv) of the power supply system [2], and the drain is coupled to a node N1. In the nMOS transistor MNd, the source is coupled to the low-potential side power supply DVSS (specifically, the low-potential side power supply wiring LNds) of the power supply system [2], and the drain is coupled to the node N1.

The input buffer IBFa includes a pMOS transistor MPa and an nMOS transistor MNa. In the pMOS transistor MPa, the source is coupled to the high-potential side power supply AVDD (specifically, the high-potential side power supply wiring LNav) of the power supply system [1]. In the nMOS transistor MNa, the source is coupled to the low-potential side power supply AVSS (low-potential side power supply wiring LNas) of the power supply system [1]. In this example, the pMOS transistor MPa and the nMOS transistor MNa constitute a CMOS inverter, the drains are commonly coupled, and the gates are commonly coupled to the node N1.

Here, the case in which the positive polarity surge is generated in the high-potential side power supply DVDD of the power supply system [2] in reference to the low-potential side power supply AVSS of the power supply system [1] as shown in FIG. 9A is assumed. As a specific example, there is the case in which a positive polarity pulse is applied from the external pad PNdv in the state where the low-potential side power supply AVSS is grounded, in the HBM (Human Body Model) test. In this case, an ESD current flowing from the high-potential side power supply DVDD of the power supply system [2] to the low-potential side power supply AVSS of the power supply system [1] is divided into an ESD current Iesd1 and an ESD current Iesd2.

The ESD current Iesd1 is a current flowing through the ESD protection circuit EPCd and the coupling circuit CC (bidirectional diode). The ESD current Iesd2 is a current flowing through the pMOS transistor MPd in the output buffer OBFd and the node N1 to a clamp circuit CLP1. Here, the impedance of the current path of the ESD current Iesd1 becomes relatively high because the coupling circuit CC is provided. Consequently, if the clamp circuit CLP1 is not provided, the ESD current Iesd2 does not flow. As a result, there is a fear that a high gate-source voltage Vgs is applied to the nMOS transistor MNa in the input buffer IBFa provided between the node N1 and the low-potential side power supply AVSS and the transistor is broken.

Therefore, it is beneficial to provide the clamp circuit CLP1 between the node N1 and the low-potential side power supply AVSS (specifically, the low-potential side power supply wiring LNas) as shown in FIG. 9A. The clamp circuit CLP1 allows the ESD current Iesd2 to flow, prevents the voltage rise between the node N1 and the low-potential side power supply AVSS, and avoids the breakage of the transistor MNa. The clamp circuit CLP1 typically includes a GG (Gate Grounded) type nMOS transistor or the like.

When the surge like this is input, various internal circuits coupled to the power supply system [2] (DVDD, DVSS) are sufficiently protected by the ESD protection circuit EPCd. Namely, in this case, only the ESD protection circuit EPCd instead of the series circuit of the ESD protection circuit EPCd and the coupling circuit CC is coupled in parallel with the various internal circuits at low impedance. As described above, the sufficient protection by the ESD protection circuits EPCd and EPCa is possible for the surge that does not span across the power supply systems.

Next, the case in which the positive polarity surge is generated in the high-potential side power supply AVDD of the power supply system [1] in reference to the low-potential side power supply DVSS of the power supply system [2] as shown in FIG. 9B is assumed. In this case, an ESD current Iesd3 flows in the current path via the protection circuit EPCa and the coupling circuit CC. However, since the impedance of the current path of the ESD current Iesd3 is high as in the case of FIG. 9A, an ESD current Iesd4 may flow from a clamp circuit CLPh through the node N1 and the nMOS transistor MNd in the output buffer OBFd.

If the clamp circuit CLPh is not provided, the ESD current Iesd4 does not flow, and thus there is a fear that a high gate-source voltage Vgs is applied to the pMOS transistor MPa in the input buffer IBFa provided between the high-potential side power supply AVDD and the node N1 and the transistor is broken. Therefore, it is beneficial to provide the clamp circuit CLPh including a GG type pMOS transistor between the high-potential side power supply AVDD (specifically, the high-potential side power supply wiring LNav) and the node N1 as in the case of FIG. 9A.

Figure 10:
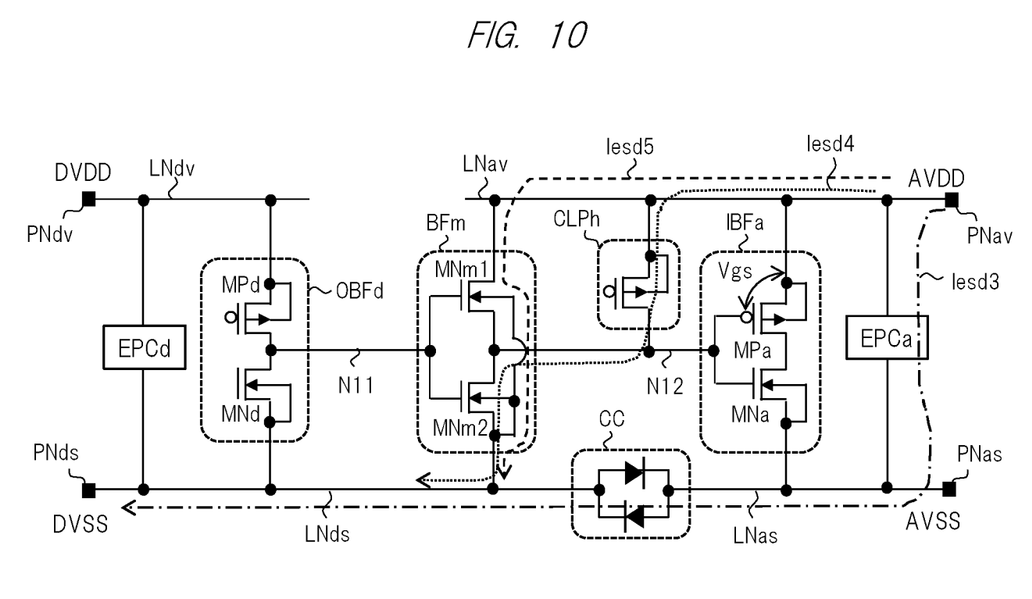
FIG. 10 is a circuit diagram showing a configuration example of a main part and an operation example different from those of FIG. 9A and FIG. 9B in a semiconductor device studied as a premise of the present invention.

FIG. 10 is a circuit diagram showing a configuration example of a main part and an operation example different from those of FIG. 9A and FIG. 9B in the semiconductor device studied as a premise of the present invention. In the semiconductor device shown in FIG. 10, as compared with the configuration examples of FIG. 9A and FIG. 9B, the clamp circuit CLP1 is removed and the intermediate buffer BFm is provided. The intermediate buffer BFm is provided so as to be inserted in the node N1 in FIG. 9A and FIG. 9B. The intermediate buffer BFm includes two nMOS transistors MNm1 and MNm2.

In the nMOS transistor MNm1, the drain is coupled to the high-potential side power supply AVDD (specifically, the high-potential side power supply wiring LNav) of the power supply system [1], and the back gate is coupled to the low-potential side power supply DVSS (specifically, the low-potential side power supply wiring LNds) of the power supply system [2]. In the nMOS transistor MNm2, both the source and the back gate are coupled to the low-potential side power supply DVSS of the power supply system [2]. The gates of the nMOS transistors MNm1 and MNm2 are coupled to a node N11 and are coupled to the output node of the output buffer OBFd via the node N11. The source of the nMOS transistor MNm1 and the drain of the nMOS transistor MNm2 are coupled to a node N12 and are coupled to the input node of the input buffer IBFa via the node N12.

By providing the intermediate buffer BFm having the nMOS transistor MNm1 instead of the pMOS transistor as described above, the high-speed transmission can be realized. Further, when such a configuration is used, the problem due to that the ESD current Iesd2 does not flow described with reference to FIG. 9A (the problem due to the absence of the clamp circuit CLP1) does not occur. Specifically, the influence of the ESD current does not reach the input buffer IBFa by interposing the intermediate buffer BFm. Instead, there is a concern about the breakage of the nMOS transistor MNm2 in the intermediate buffer BFm.

However, the source (and the back gate) of the nMOS transistor MNm2 is coupled to the low-potential side power supply DVSS of the power supply system [2] instead of the low-potential side power supply AVSS of the power supply system [1]. Consequently, unlike the case of FIG. 9A, the nMOS transistor MNm2 is protected by the ESD protection circuit EPCd without being affected by the impedance of the coupling circuit CC. Therefore, even if the clamp circuit CLP1 is not present, the nMOS transistor MNm2 is not broken. On the other hand, with respect to the ESD currents Iesd3 and Iesd4 described with reference to FIG. 9B, the same problem may occur due to the nMOS transistor MNm2 in the intermediate buffer BFm in FIG. 10 instead of the nMOS transistor MNd in the output buffer OBFd in FIG. 9B. Therefore, the clamp circuit CLPh is provided.

However, it has been found that when the configuration example shown in FIG. 10 is used, an ESD current Iesd5 flows through another path and it may cause a problem. Specifically, the ESD current Iesd5 is a current flowing from the high-potential side power supply AVDD of the power supply system [1] to the low-potential side power supply DVSS of the power supply system [2] via the back gate of the nMOS transistor MNm1 in the intermediate buffer BFm. The ESD current Iesd5 flows through the pn junction between the n$^+$ type drain diffusion layer and the p type well serving as the back gate in the nMOS transistor MNm1. It has been found that thermal breakdown could occur at the pn junction at this time.

In order to solve such a problem, a method of reducing the impedance of the ESD protection circuit EPCa and the coupling circuit CC is conceivable. Specifically, for example, a method of increasing the size of the gate width of the bypass nMOS transistor in the ESD protection circuit EPCa, a method of increasing the size of the bidirectional diode in the coupling circuit CC, and the like are possible. However, when such methods are used, the area of the semiconductor chip and the cost may increase. Therefore, it is beneficial to use the following method.

((Configuration of Main Part of Semiconductor Device (First Embodiment)))

Figure 2:
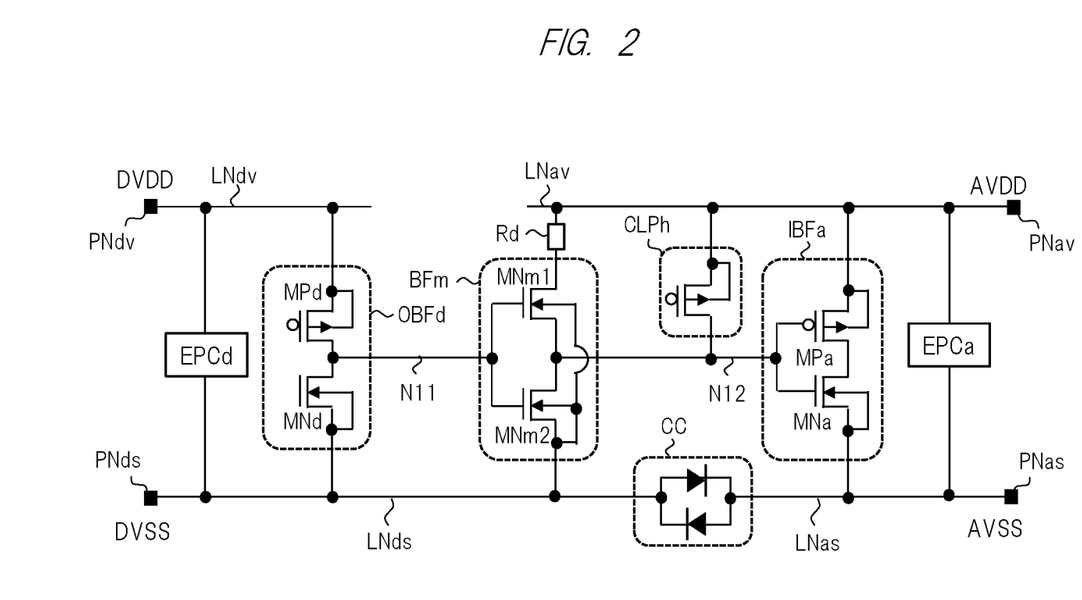
FIG. 2 is a circuit diagram showing a configuration example of a main part in the semiconductor device according to the first embodiment of the present invention.

FIG. 2 is a circuit diagram showing a configuration example of a main part in the semiconductor device according to the first embodiment of the present invention. The semiconductor device shown in FIG. 2 further includes a resistor element Rd as compared with the configuration example shown in FIG. 10. In FIG. 2, in the nMOS transistor MNm1 in the intermediate buffer BFm, the drain is coupled to the high-potential side power supply AVDD of the power supply system [1] and the back gate is coupled to the low-potential side power supply DVSS of the power supply system [2] as described above.

Here, the resistor element Rd is inserted in series between the drain of the nMOS transistor MNm1 in the intermediate buffer BFm and the high-potential side power supply AVDD (specifically, the high-potential side power supply wiring LNav) of the power supply system [1]. By providing the resistor element Rd, the ESD current Iesd5 in FIG. 10 can be reduced. As a result, in the nMOS transistor MNm1, the thermal breakdown that may occur at the pn junction between the n$^+$ type drain diffusion layer and the p type well serving as the back gate can be prevented.

Figure 3:
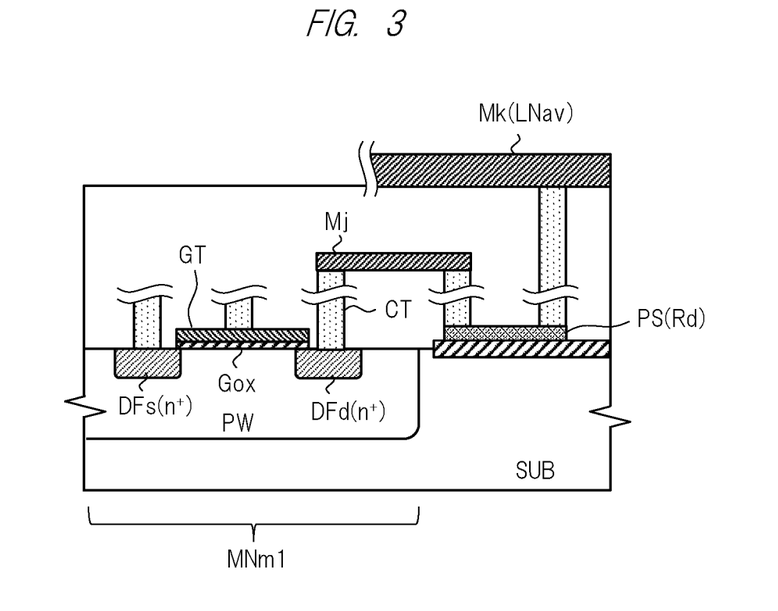
FIG. 3 is a cross-sectional view showing an example of a schematic device structure around a resistor element in the semiconductor device in FIG. 2.

FIG. 3 is a cross-sectional view showing an example of a schematic device structure around the resistor element in the semiconductor device in FIG. 2. In FIG. 3, the nMOS transistor MNm1 in FIG. 2 includes a p type well PW formed in a semiconductor substrate SUB, an n$^+$ type source diffusion layer DFs (n$^+$) and an n$^+$ type drain diffusion layer DFd (n$^+$) formed in the p type well PW, and a gate insulating film Gox and a gate layer GT formed on the semiconductor substrate SUB.

Further, a polysilicon layer PS(Rd) is formed on the semiconductor substrate SUB. One end of the polysilicon layer PS(Rd) is connected to the drain diffusion layer DFd (n$^+$) via a contact layer CT and a metal wiring layer Mj. The other end of the polysilicon layer PS(Rd) is connected to a metal wiring layer Mk (LNav) serving as the high-potential side power supply wiring LNav of the power supply system [1] via the contact layer CT. The resistor element Rd of FIG. 3 is mainly formed of the drain diffusion layer DFd (n$^+$) and the polysilicon layer PS(Rd). The resistance value of the resistor element Rd is appropriately determined in accordance with the ESD resistance of the nMOS transistor MNm1, but is typically several hundred Ω (100 to 1000Ω) or the like.

((Main Effect of First Embodiment))

As described above, by using the semiconductor device according to the first embodiment, typically, the ESD resistance can be improved. In particular, in the semiconductor device (semiconductor chip) including a plurality of power supply systems provided for a plurality of analog circuit blocks and digital circuit blocks, the ESD resistance (for example, HBM resistance) of the intermediate buffer BFm provided between different power supply systems can be improved. Further, it is possible to obtain the effect while suppressing the increase in the circuit area (for example, size-up of the ESD protection circuit and the bidirectional diode).

In this example, the intermediate buffer BFm is provided between the high-potential side power supply AVDD of the power supply system [1] and the low-potential side power supply DVSS of the power supply system [2]. Similarly, an intermediate buffer (referred to as BFm2) may be provided between the high-potential side power supply DVDD of the power supply system [2] and the low-potential side power supply AVSS of the power supply system [1]. In this case, the same resistor element Rd is provided also for the nMOS transistor MNm1 in this intermediate buffer (BFm2).

Second Embodiment ((Configuration of Main Part of Semiconductor Device (Second Embodiment)))

Figure 4:
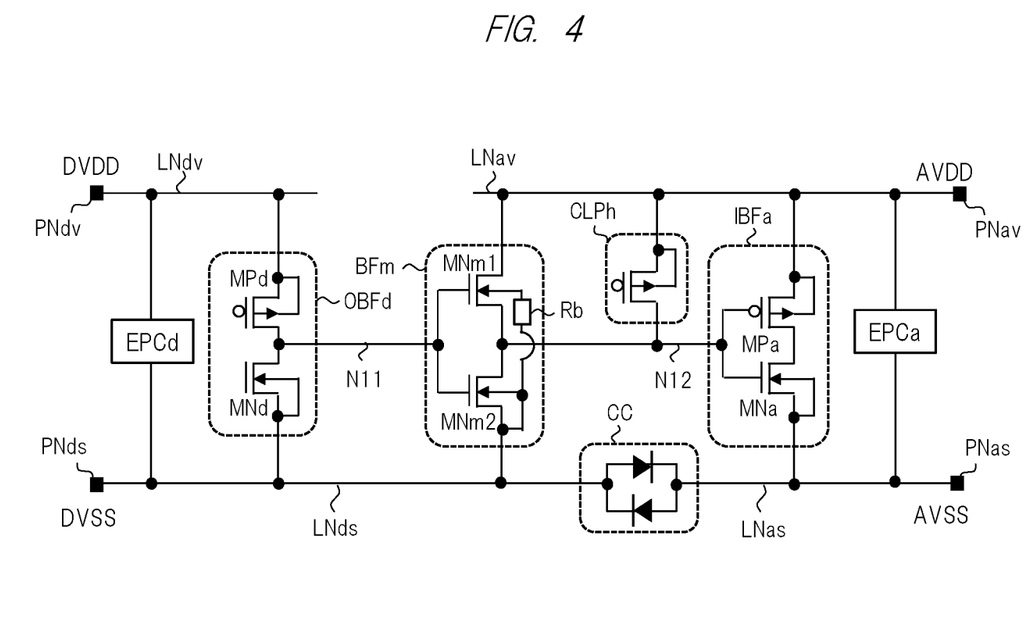
FIG. 4 is a circuit diagram showing a configuration example of a main part in a semiconductor device according to the second embodiment of the present invention.

FIG. 4 is a circuit diagram showing a configuration example of a main part in a semiconductor device according to the second embodiment of the present invention. Unlike the configuration example of FIG. 2, the semiconductor device shown in FIG. 4 includes a resistor element Rb instead of the resistor element Rd. The resistor element Rb is inserted in series between the back gate of the nMOS transistor MNm1 in the intermediate buffer BF and the low-potential side power supply DVSS (specifically, the low-potential side power supply wiring LNds) of the power supply system [2]. Note that the drain of the nMOS transistor MNm1 is coupled to the high-potential side power supply AVDD of the power supply system [1].

By providing the resistor element Rb, the ESD current Iesd5 in FIG. 10 can be reduced as in the case of FIG. 2. As a result, the thermal breakdown that may occur at the pn junction of the nMOS transistor MNm1 can be prevented. When the intermediate buffer (BFm2) coupled to the high-potential side power supply DVDD of the power supply [2] described in the first embodiment is provided in FIG. 4, the same resistor element Rb is provided also for the nMOS transistor MNm1 in the intermediate buffer (BFm2).

Figure 5:
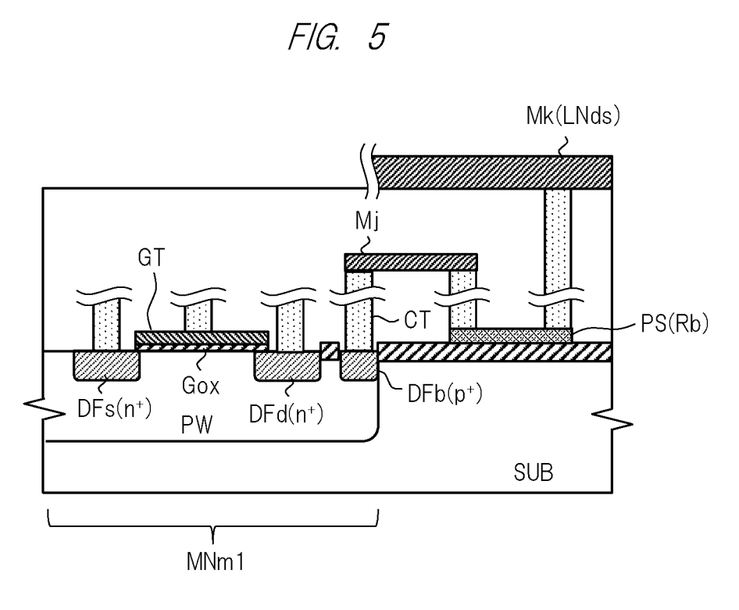
FIG. 5 is a cross-sectional view showing an example of a schematic device structure around a resistor element in the semiconductor device in FIG. 4.

FIG. 5 is a cross-sectional view showing an example of a schematic device structure around the resistor element in the semiconductor device in FIG. 4. FIG. 5 shows the nMOS transistor MNm1 similar to that in the case of FIG. 3. Also, a $p^+$ type power supply diffusion layer DFb ($p^+$) is formed in the p type well PW serving as the back gate of the nMOS transistor MNm1. Further, the polysilicon layer PS(Rd) is formed on the semiconductor substrate SUB.

One end of the polysilicon layer PS(Rd) is connected to the power supply diffusion layer DFd($p^+$) via the contact layer CT and the metal wiring layer Mj. The other end of the polysilicon layer PS(Rd) is connected to a metal wiring layer Mk(LNds) serving as the low-potential side power supply wiring LNds of the power supply system [2] via the contact layer CT. The resistor element Rb of FIG. 5 is mainly formed of the power supply diffusion layer DFb($p^+$) and the polysilicon layer PS(Rd). The resistance value of the resistor element Rb is appropriately determined in accordance with the ESD resistance of the nMOS transistor MNm1, but is typically several hundred Ω (100 to 1000Ω) or the like.

Note that the nMOS transistor MNm2 shown in FIG. 4 is formed in the same p type well PW as the nMOS transistor MNm1 or is formed in a p type well different from the nMOS transistor MNm1. In the latter case, each of the p type wells is separated by an n type deep well (not shown).

((Main Effect of Second Embodiment))

As described above, by using the semiconductor device according to the second embodiment, the same various effects as those described in the first embodiment can be obtained. Further, unlike the method of the first embodiment, the resistor element Rb is coupled to the back gate of the nMOS transistor MNm1 instead of the drain, and thus it is possible to suppress the decrease in driving capability of the nMOS transistor MNm1 (therefore, the decrease in transmission speed, etc.).

Third Embodiment ((Configuration of Main Part of Semiconductor Device (Third Embodiment)))

Figure 6:
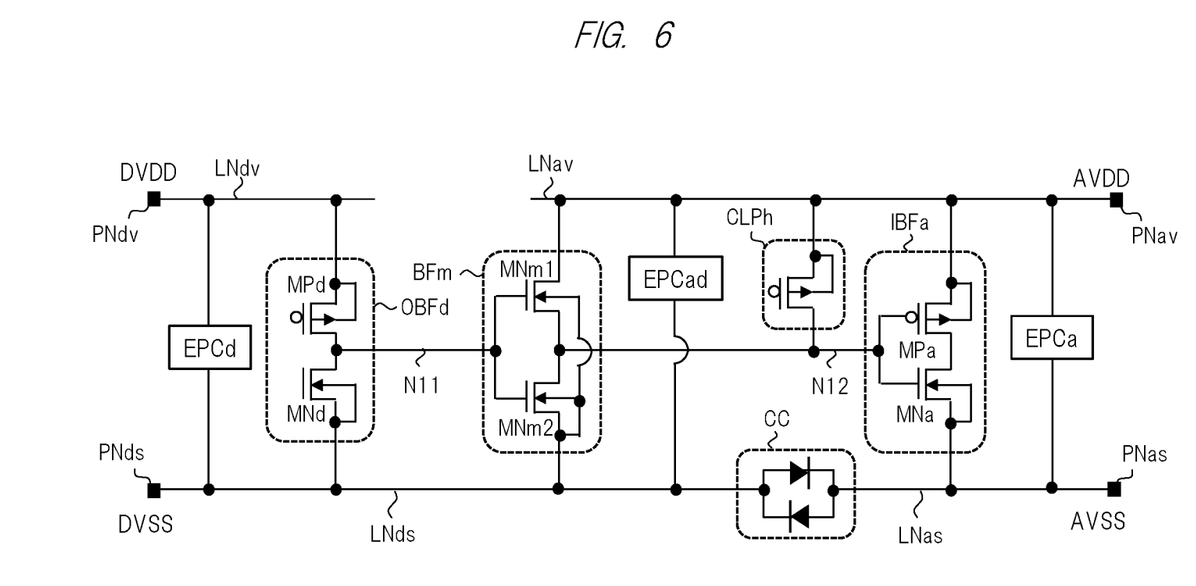
FIG. 6 is a circuit diagram showing a configuration example of a main part in a semiconductor device according to the third embodiment of the present invention.

FIG. 6 is a circuit diagram showing a configuration example of a main part in the semiconductor device according to the third embodiment of the present invention. The semiconductor device shown in FIG. 6 further includes an ESD protection circuit EPCad as compared with the configuration example shown in FIG. 10. The ESD protection circuit EPCad is provided between the high-potential side power supply AVDD (specifically, the high-potential side power supply wiring LNav) of the power supply system [1] and the low-potential side power supply DVSS (specifically, the low-potential side power supply wiring LNds) of the power supply system [2], and absorbs the input surge.

By providing the ESD protection circuit EPCad, the surge input between the high-potential side power supply AVDD of the power supply system [1] and the low-potential side power supply DVSS of the power supply system [2] can be absorbed, and thus the ESD current Iesd5 in FIG. 10 can be reduced. As a result, the thermal breakdown that may occur at the pn junction of the nMOS transistor MNm1 in the intermediate buffer BFm can be prevented as in the cases of the first and second embodiments.

Figure 7:
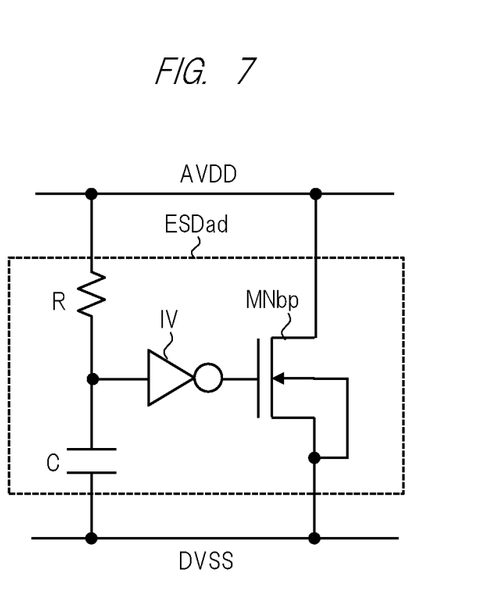
FIG. 7 is a circuit diagram showing a typical configuration example of an ESD protection circuit in FIG. 6.

FIG. 7 is a circuit diagram showing a typical configuration example of the ESD protection circuit in FIG. 6. The ESD protection circuit EPCad shown in FIG. 7 includes a timer circuit composed of a resistor (R) and a capacitor (C), an inverter INV, and a bypass nMOS transistor MNbp. For example, when a positive polarity surge is input to the high-potential side power supply AVDD in reference to the low-potential side power supply DVSS, the input voltage of the inverter IV rises at the RC time constant (the output voltage of the inverter IV falls at the RC time constant). As a result, the bypass nMOS transistor MNbp is turned on in a period corresponding to the RC time constant after the surge is input, and absorbs the surge in this period.

When the intermediate buffer (BFm2) coupled to the high-potential side power supply DVDD of the power supply [2] described in the first and second embodiments is provided in FIG. 6, the same ESD protection circuit is provided also between the high-potential side power supply DVDD of the power supply system [2] and the low-potential side power supply AVSS of the power supply system [1]. Also, the ESD protection circuit EPCad is not limited to the configuration shown in FIG. 7 and may have various commonly-known configurations. The ESD protection circuits EPCa and EPCd may also have the configuration shown in FIG. 7 and the other commonly-known configurations.

((Main Effect of Third Embodiment))

As described above, by using the semiconductor device according to the third embodiment, it is possible to improve the ESD resistance with the minimum necessary circuit area overhead. Namely, it is only necessary to provide the ESD protection circuit between the power supply systems provided with the intermediate buffer among the mutually different power supply systems, and it is not particularly needed to provide the ESD protection circuit between all the power supply systems. Also, in the methods of the first and second embodiments, for example, it is necessary to arrange the resistor element in the internal circuit region where the element density is high, and thus the layout design is not easy in some cases. In the method of the third embodiment, since the degree of freedom regarding the arrangement position of the ESD protection circuit EPCad is high, it is possible to facilitate the layout design.

Fourth Embodiment ((Layout Configuration of Semiconductor Device))

Figure 8:
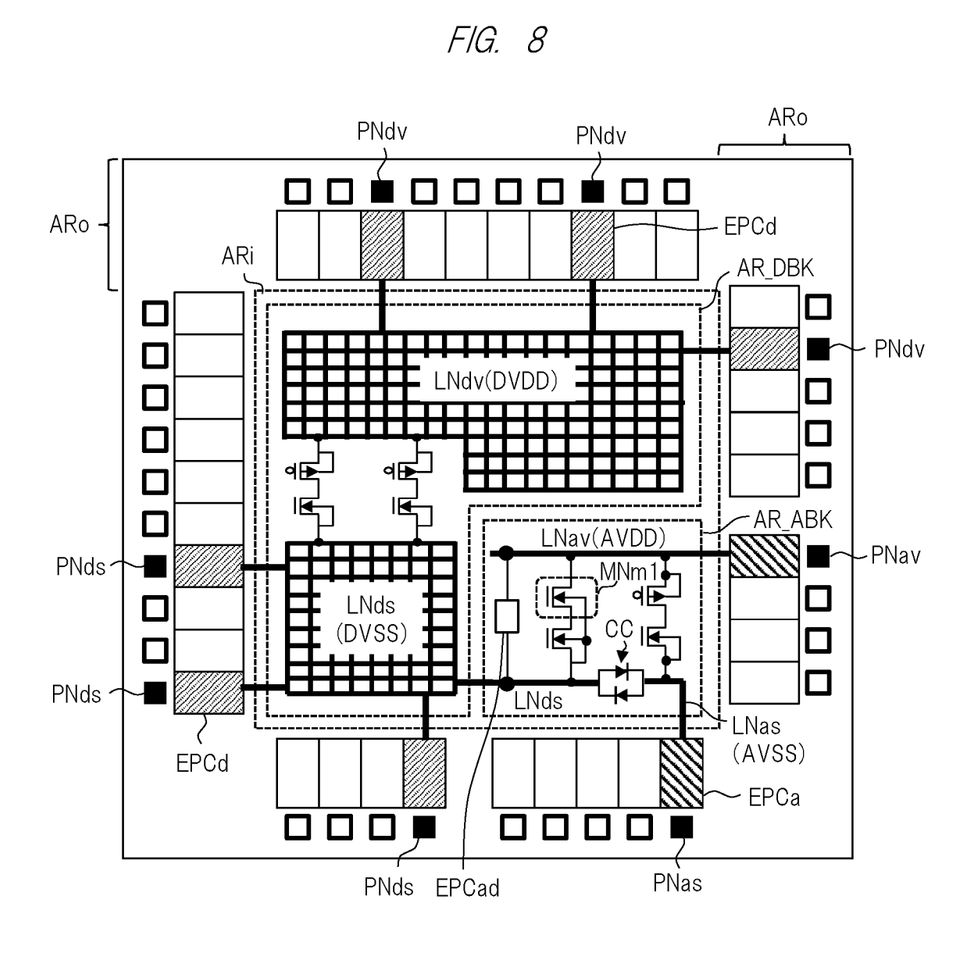
FIG. 8 is a plan view showing an example of a layout configuration corresponding to FIG. 1 and FIG. 6 in a semiconductor device according to the fourth embodiment of the present invention.

FIG. 8 is a plan view showing an example of a layout configuration corresponding to FIG. 1 and FIG. 6 in a semiconductor device according to the fourth embodiment of the present invention. As shown in FIG. 8, in an outer peripheral region ARo of the semiconductor device (semiconductor chip), various external pads including the external pads PNav and PNas of the power supply system [1] and the external pads PNdv and PNds of the power supply system [2] are arranged. Also, in the outer peripheral region ARo, the ESD protection circuit EPCa is arranged adjacent to the external pads PNav and PNas of the power supply system [1] and the ESD protection circuit EPCd is arranged adjacent to the external pads PNdv and PNds of the power supply system [2].

On the other hand, in an inner region ARi inside the outer peripheral region ARo, an analog circuit formation region AR_ABK and a digital circuit formation region AR_DBK are provided. In the analog circuit formation region AR_ABK, the high-potential side power supply wiring LNav coupled to the external pad PNav and the low-potential side power supply wiring LNas coupled to the external pad PNas are arranged. In the digital circuit formation region AR_DBK, the high-potential side power supply wiring LNdv coupled to the external pad PNdv and the low-potential side power supply wiring LNds coupled to the external pad PNds are arranged. In this example, the high-potential side power supply wiring LNdv and the low-potential side power supply wiring LNds are formed by mesh-shaped metal wiring.

Here, the nMOS transistor MNm1 in the intermediate buffer BFm shown in FIG. 6 is arranged at the boundary portion (included in the analog circuit formation region AR_ABK in this example) between the analog circuit formation region AR_ABK and the digital circuit formation region AR_DBK. Then, the ESD protection circuit EPCad shown in FIG. 6 is arranged in the vicinity of the nMOS transistor MNm1. Note that the coupling circuit CC and the like are also arranged at the boundary portion.

By arranging the ESD protection circuit EPCad in the vicinity of the nMOS transistor MNm1 in the inner region ARi instead of the outer peripheral region ARo as described above, the potential difference generated between the drain and the back gate of the nMOS transistor MNm1 at the time of surge input can be reduced. As a result, the ESD resistance can be further improved.

Further, by arranging the ESD protection circuit EPCad in the inner region ARi, the heat generation due to the operation at the time of surge input can be reduced as compared with the case in which it is arranged in the outer peripheral region ARo. As a result, the area of the ESD protection circuit EPCad can be made smaller than the area of the ESD protection circuit (for example, EPCa) arranged in the outer peripheral region ARo. Specifically, for example, the bypass nMOS transistor MNbp or the like in the ESD protection circuit EPCad shown in FIG. 7 can be configured with an element size (gate width) smaller than that of the transistor in the ESD protection circuit EPCa.

((Main Effect of Fourth Embodiment))

As described above, by using the semiconductor device according to the fourth embodiment, the same various effects as those described in the third embodiment can be obtained. In addition, it is possible to achieve the improvement in the ESD resistance, the suppression of the circuit area overhead (therefore, cost reduction), and the like.

In the foregoing, the invention made by the inventors of this application has been specifically described based the embodiments, but the present invention is not limited to the embodiments described above and can be variously modified within the range not departing from the gist thereof. For example, the embodiments above have been described in detail in order to make the present invention easily understood, and the present invention is not necessarily limited to the embodiments having all of the described configurations. Also, a part of the configuration of one embodiment may be replaced with the configuration of another embodiment, and the configuration of one embodiment may be added to the configuration of another embodiment. Furthermore, another configuration may be added to a part of the configuration of each embodiment, and a part of the configuration of each embodiment may be eliminated or replaced with another configuration.

For example, it is possible in some cases to use the methods of the first to fourth embodiments in combination as appropriate. Namely, the resistor element Rd of the first embodiment and the resistor element Rb of the second embodiment can be used in combination, or the resistor element Rd of the first embodiment or the resistor element Rb of the second embodiment and the ESD protection circuit EPCad of the third embodiment can be used in combination.

What is claimed is:

1. A semiconductor device including a first power supply system composed of a first high-potential side power supply and a first low-potential side power supply and a second power supply system composed of a second high-potential side power supply and a second low-potential side power supply, the semiconductor device comprising:
   a first ESD protection circuit provided between the first high-potential side power supply and the first low-potential side power supply and configured to absorb an input surge;
   a second ESD protection circuit provided between the second high-potential side power supply and the second low-potential side power supply and configured to absorb an input surge;
   a coupling circuit including a bidirectional diode and configured to couple the first low-potential side power supply and the second low-potential side power supply;
   a first transistor composed of an n-channel MOS transistor, having a drain coupled to the first high-potential side power supply, and having a back gate coupled to the second low-potential side power supply;
   a first resistor element inserted in series between the drain of the first transistor and the first high-potential side power supply;
   an input buffer to which a signal from the first transistor is input and which is coupled to the first high-potential side power supply and the first low-potential side power supply; and
   a clamp circuit configured to clamp an input node of the input buffer,
   wherein the clamp circuit is provided between the input node and the first high-potential side power supply and is not provided between the input node and the first low-potential side power supply.

2. The semiconductor device according to claim 1, further comprising:
   an analog circuit block coupled to the first power supply system; and
   a digital circuit block coupled to the second power supply system.

3. The semiconductor device according to claim 1, further comprising:
   a second transistor composed of an n-channel MOS transistor, having a drain coupled to the second high-potential side power supply, and having a back gate coupled to the first low-potential side power supply; and
   a second resistor element inserted in series between the drain of the second transistor and the second high-potential side power supply.

4. A semiconductor device including a first power supply system composed of a first high-potential side power supply and a first low-potential side power supply and a second power supply system composed of a second high-potential side power supply and a second low-potential side power supply, the semiconductor device comprising:
- a first ESD protection circuit provided between the first high-potential side power supply and the first low-potential side power supply and configured to absorb an input surge;
- a second ESD protection circuit provided between the second high-potential side power supply and the second low-potential side power supply and configured to absorb an input surge;
- a coupling circuit including a bidirectional diode and configured to couple the first low-potential side power supply and the second low-potential side power supply;
- a first transistor composed of an n-channel MOS transistor, having a drain coupled to the first high-potential side power supply, and having a back gate coupled to the second low-potential side power supply;
- a first resistor element inserted in series between the back gate of the first transistor and the second low-potential side power supply;
- an input buffer to which a signal from the first transistor is input and which is coupled to the first high-potential side power supply and the first low-potential side power supply; and
- a clamp circuit configured to clamp an input node of the input buffer,
- wherein the clamp circuit is provided between the input node and the first high-potential side power supply and is not provided between the input node and the first low-potential side power supply.

5. The semiconductor device according to claim 4, further comprising:
- an analog circuit block coupled to the first power supply system; and
- a digital circuit block coupled to the second power supply system.

6. The semiconductor device according to claim 4, further comprising:
- a second transistor composed of an n-channel MOS transistor, having a drain coupled to the second high-potential side power supply, and having a back gate coupled to the first low-potential side power supply; and
- a second resistor element inserted in series between the back gate of the second transistor and the first low-potential side power supply.

7. A semiconductor device including a first power supply system composed of a first high-potential side power supply and a first low-potential side power supply and a second power supply system composed of a second high-potential side power supply and a second low-potential side power supply, the semiconductor device comprising:
- a first ESD protection circuit provided between the first high-potential side power supply and the first low-potential side power supply and configured to absorb an input surge;
- a second ESD protection circuit provided between the second high-potential side power supply and the second low-potential side power supply and configured to absorb an input surge;
- a coupling circuit including a bidirectional diode and configured to couple the first low-potential side power supply and the second low-potential side power supply;
- a first transistor composed of an n-channel MOS transistor, having a drain coupled to the first high-potential side power supply, and having a back gate coupled to the second low-potential side power supply; and
- a third ESD protection circuit provided between the first high-potential side power supply and the second low-potential side power supply and configured to absorb an input surge.

8. The semiconductor device according to claim 7, wherein the third ESD protection circuit is composed of an element having a size smaller than the first ESD protection circuit.

9. The semiconductor device according to claim 7, being composed of one semiconductor chip,
- wherein the first ESD protection circuit and the second ESD protection circuit are arranged in an outer peripheral region of the semiconductor chip, and
- wherein the third ESD protection circuit is arranged in the vicinity of the first transistor in an inner region inside the outer peripheral region.

10. The semiconductor device according to claim 7, further comprising:
- an input buffer to which a signal from the first transistor is input and which is coupled to the first high-potential side power supply and the first low-potential side power supply; and
- a clamp circuit configured to clamp an input node of the input buffer,
- wherein the clamp circuit is provided between the input node and the first high-potential side power supply and is not provided between the input node and the first low-potential side power supply.

11. The semiconductor device according to claim 7, further comprising:
- a second transistor composed of an n-channel MOS transistor, having a drain coupled to the second high-potential side power supply, and having a back gate coupled to the first low-potential side power supply; and
- a fourth ESD protection circuit provided between the second high-potential side power supply and the first low-potential side power supply and configured to absorb an input surge.

* * * * *